(12) United States Patent
Gorman et al.

(10) Patent No.: US 8,570,820 B2
(45) Date of Patent: Oct. 29, 2013

(54) SELECTABLE REPAIR PASS MASKING

(75) Inventors: Kevin William Gorman, Fairfax, VT (US); John Robert Goss, South Burlington, VT (US); Michael Richard Ouellette, Westford, VT (US); Troy Joseph Perry, Georgia, VT (US); Michael Anthony Ziegerhofer, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 300 days.

(21) Appl. No.: 13/042,881

(22) Filed: Mar. 8, 2011

(65) Prior Publication Data

US 2012/0230136 A1    Sep. 13, 2012

(51) Int. Cl.
*G11C 7/10* (2006.01)

(52) U.S. Cl.
USPC ..................................... 365/200; 365/189.05

(58) Field of Classification Search
USPC ............................................ 365/200, 189.05
See application file for complete search history.

(56) References Cited

U.S. PATENT DOCUMENTS

| | | | |
|---|---|---|---|
| 5,796,662 A * | 8/1998 | Kalter et al. | 365/200 |
| 5,943,686 A | 8/1999 | Arimilli et al. | |
| 5,958,068 A | 9/1999 | Arimilli et al. | |
| 6,667,918 B2 * | 12/2003 | Leader et al. | 365/201 |
| 6,766,468 B2 | 7/2004 | Barth, Jr. et al. | |
| 6,768,694 B2 | 7/2004 | Anand et al. | |
| 6,829,728 B2 | 12/2004 | Cheng et al. | |
| 6,856,569 B2 | 2/2005 | Nelson et al. | |
| 6,922,649 B2 | 7/2005 | Mondal et al. | |
| 6,957,371 B2 | 10/2005 | Ricchetti et al. | |
| 6,993,692 B2 | 1/2006 | Ouellette et al. | |
| 7,016,243 B1 * | 3/2006 | Srinivasan et al. | 365/200 |
| 7,237,154 B1 | 6/2007 | Zorian | |
| 7,330,383 B2 | 2/2008 | Takai | |
| 7,490,276 B1 | 2/2009 | White et al. | |
| 7,793,173 B2 | 9/2010 | Chang et al. | |
| 2009/0154270 A1 | 6/2009 | Barth, Jr. et al. | |

OTHER PUBLICATIONS

S. Shoukourian et al. "An Approach for Evaluation of Redundancy Analysis Algorithms." 2001 IEEE International Workshop on Memory Technology, Design and Testing. pp. 51-55, 2001.

DA Wang et al. "Hierarchical Fault Tolerance Memory Architecture with 3-Dimension Interconnect." TENCON 2007—2007 IEEE Region 10 Conference, pp. 1-4, Oct. 30, 2007-Nov. 2, 2007.

* cited by examiner

*Primary Examiner* — Son Dinh
*Assistant Examiner* — Nam Nguyen
(74) *Attorney, Agent, or Firm* — Alexander Viderman; David Cain; L. Jeffrey Kelly

(57) ABSTRACT

The present invention relates to a method and circuit for selectively repairing an embedded memory module having memory elements in an integrated circuit chip. The method includes performing a plurality of tests on the embedded memory module under operating conditions to identify a plurality of non-operational memory elements in the embedded memory module and, in response to identifying the non-operational memory elements, generating a plurality of corresponding repair solutions. The method further includes storing the plurality of corresponding repair solutions in a non-volatile storage element and determining from a mask a subset of the plurality of repair solutions that should be restored.

20 Claims, 5 Drawing Sheets

SELECTABLE REPAIR PASS MASKING

BACKGROUND

Field of the Invention

The present invention relates to the field of testing and replacing defective memory devices, and more particularly, to selectable repair pass masking.

Many of today's integrated circuit (IC) designs are a complete system on a chip (SOC) that include a processor core, multiple embedded memories, logic, I/O ports, etc. The number of embedded memories contained within a SOC continues to grow rapidly. This growth has driven the need for reevaluating manufacturing test strategies because embedded memories typically represent a die's largest contributor to yield loss due to the very large area and density of these regular circuits. Embedded memories are the densest components within a SOC, accounting for up to 90% of the chip area. Memories are also the most sensitive to manufacturing process defects, making it essential to thoroughly test them in a SOC.

Efficient testing schemes that guarantee very high fault coverage, while minimizing test cost and chip area overhead, have become essential. However, as the complexity of circuits continues to increase, high-fault coverage of several types of fault models becomes more difficult to achieve with traditional testing paradigms. A successful memory testing strategy must also incorporate some form of repair methodology in order to achieve profitable yield levels.

SUMMARY

Broadly speaking, embodiments of the present invention contemplate a method for selectively repairing an embedded memory module having memory elements in an integrated circuit chip. The method comprises performing a plurality of tests on the embedded memory module under operating conditions to identify a plurality of non-operational memory elements in the embedded memory module and, in response to identifying the non-operational memory elements, generating a plurality of corresponding repair solutions. The method further comprises storing the plurality of corresponding repair solutions in a non-volatile storage element and determining from a mask a subset of the plurality of corresponding repair solutions that should be restored.

Embodiments of the present invention further contemplate a circuit for selectively repairing an embedded memory module having memory elements in an integrated circuit chip. The circuit comprises a non-volatile storage element adapted to store a plurality of repair solutions, wherein the repair solutions are generated in response to identifying non-operational memory elements. The circuit further comprises a repair mask register adapted to store a plurality of mask bits associated with each of the plurality of repair solutions stored in the non-volatile storage element. Additionally, the circuit comprises control logic for selectively restoring a subset of the plurality of repair solutions stored in the non-volatile storage element based on the mask bits, wherein the control logic is electrically coupled to both the non-volatile storage element and the repair mask register.

A more complete understanding of the present invention, as well as further features and advantages of the present invention, will be obtained by reference to the following detailed description and drawings. It is to be understood that both the foregoing general description and the following detailed description are exemplary and explanatory only, and should not be considered restrictive of the scope of the invention, as described and claimed. Further, features or variations may be provided in addition to those set forth herein. For example, embodiments of the invention may be directed to various combinations and sub-combinations of the features described in the detailed description.

BRIEF DESCRIPTION OF THE SEVERAL VIEWS OF THE DRAWINGS

The present invention is described in the detailed description which follows in reference to the noted plurality of drawings by way of non-limiting examples of exemplary embodiments of the present invention.

DETAILED DESCRIPTION

Figure 1:
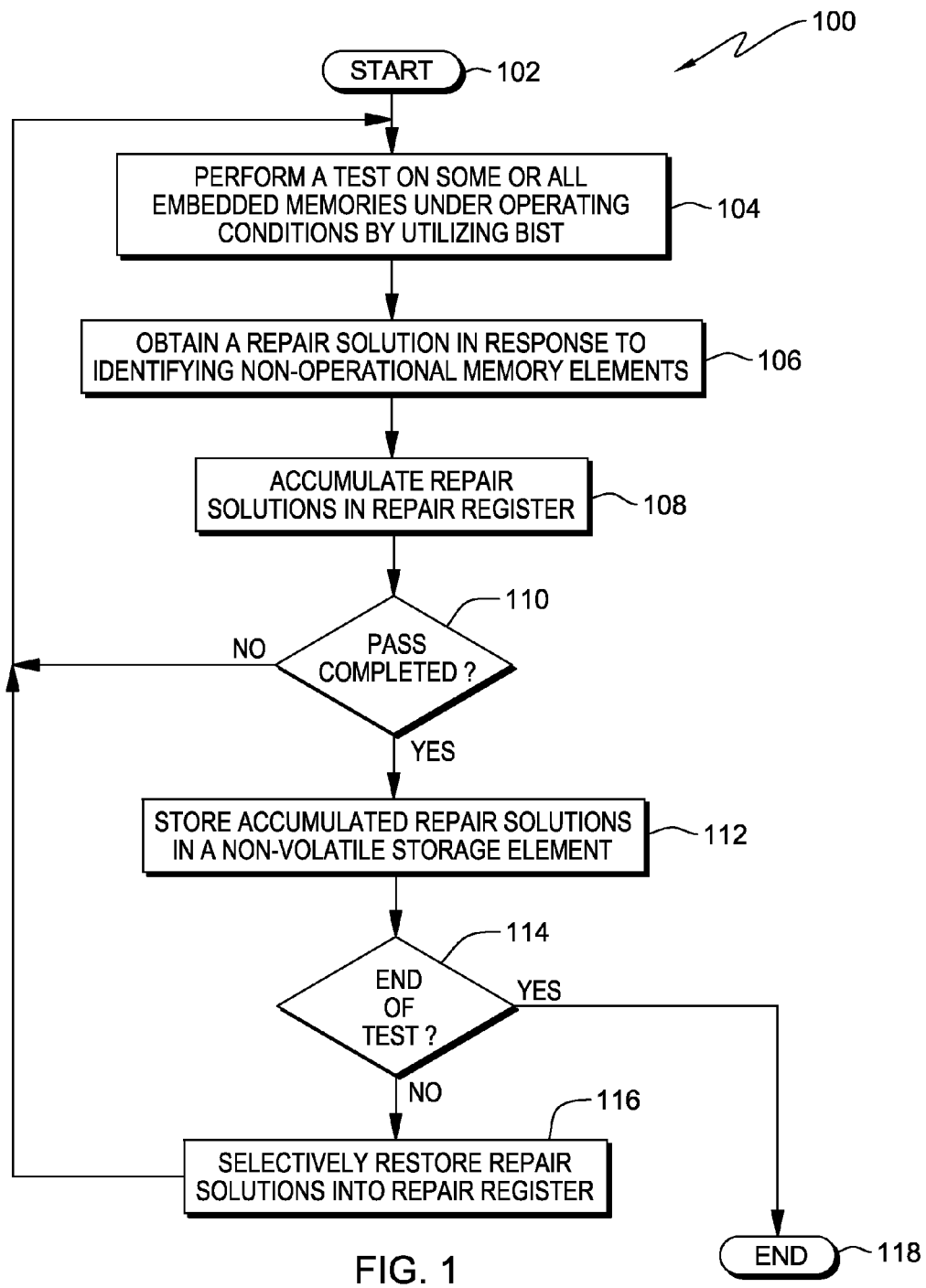
FIG. 1 is a flowchart illustrating a method for selectively repairing an embedded memory module utilizing selectable repair pass masking, in accordance with embodiments of the present invention.

The present invention relates to the field of testing an embedded memory portion of a generic semiconductor IC, which is being subjected to a method of memory Built-In Self-Test (BIST) and repair pursuant to a novel method of selectively repairing an embedded memory module having memory elements in an integrated circuit chip. The method comprises performing a plurality of tests on the embedded memory module under operating conditions to identify a plurality of non-operational memory elements in the embedded memory module and, in response to identifying the non-operational memory elements, generating a plurality of corresponding repair solutions. The method further comprises storing the plurality of corresponding repair solutions in a non-volatile storage element and determining from a mask a subset of the plurality of corresponding repair solutions that should be restored.

In embodiments of the present invention, an embedded memory is a memory, which is connected with logic circuits in an integral manner on the chip, and is distinguished from a standalone memory chip which is easier to access and repair. Several different types of memories may be used in modern ICs. These memories include, for example, but not limited to, embedded Static Random Access Memory (SRAM), Dynamic Random Access Memory (DRAM), Ternary Content Addressable Memory (TCAM) and other repairable memory types. In preferred embodiments of the present invention, an embedded memory module comprises one or more arrays of memory elements (rows and columns), including redundant memory elements (rows and columns) and testable via a BIST engine. Conventional testing of embedded memory containing BIST engines involve some form of embedded on chip or external off chip fuse or embedded on chip latch structures to control the invocations of spare or redundant elements within the memory array elements for failure relief. Thus, redundant elements may be used in a scheme to replace defective non-redundant elements, discovered during initial testing of the IC memory device. During test mode of the fabricated chip, a BIST engine is instructed to supply a series of patterns to the ports of an embedded memory. These patterns, also known as test algorithms, typically include, but are not limited to, march-type and checkerboard-type patterns that cause a memory to produce deterministic output data. The output data can be directly compared with reference data from the BIST controller. The comparison generates a signal indicating that the memory passed or failed the test. Generally, once each test is completed, a repair solution is generated. The use of redundant elements and repair solutions is important in increasing the overall yield of manufacturing ICs with memory devices in a single chip.

To use a BIST testing method, one or more BIST controllers are inserted within the SOC during the chip's design using a software design tool. The chip is then fabricated with the added BIST engines and BIST controllers. A BIST controller typically includes a finite state machine and control, data, and address registers, for reading and writing data to a memory. Usually, multiplexers are used to switch the IC from a test mode (where the BIST controller controls the memory) to an operational mode (where the circuit logic reads and writes memory).

To enable multiple on-chip repairs, before a BIST engine is run, it is provided access to previously stored results or is initialized so that it has a valid starting point. This initialization and restoration is typically orchestrated by a BIST controller. To add more complexity to the system not all BIST engines always operate concurrently. For example, SRAM BIST engines may be run concurrently and DRAM BIST engines may be run concurrently, however, SRAM and DRAM BIST engines may not be run concurrently because the SRAM and DRAM BIST engines have different operating requirements and different tester stimuli.

One of the central elements enabling on-chip self repair is the electrically-programmed fuse (e-fuse). The e-fuse can best be viewed as an electronically programmed read-only bit. The fuse has two possible logic states. It can remain intact where its value is evaluated as a logical "zero". The other state is "programmed" (e.g. blown, opened, etc.) and evaluates to a logical "one". A multiple repair capability provides leverage for testing and repairing memories across different operating conditions, for example, but not limited to, across various temperatures, by allowing generated repair solutions from multiple tests to be stored in non-volatile memory like e-fuses. This composite data comprising repair solutions calculated across multiple tests can then be accessed after manufacturing test completes by reading data from the non-volatile memory.

Figure 2:
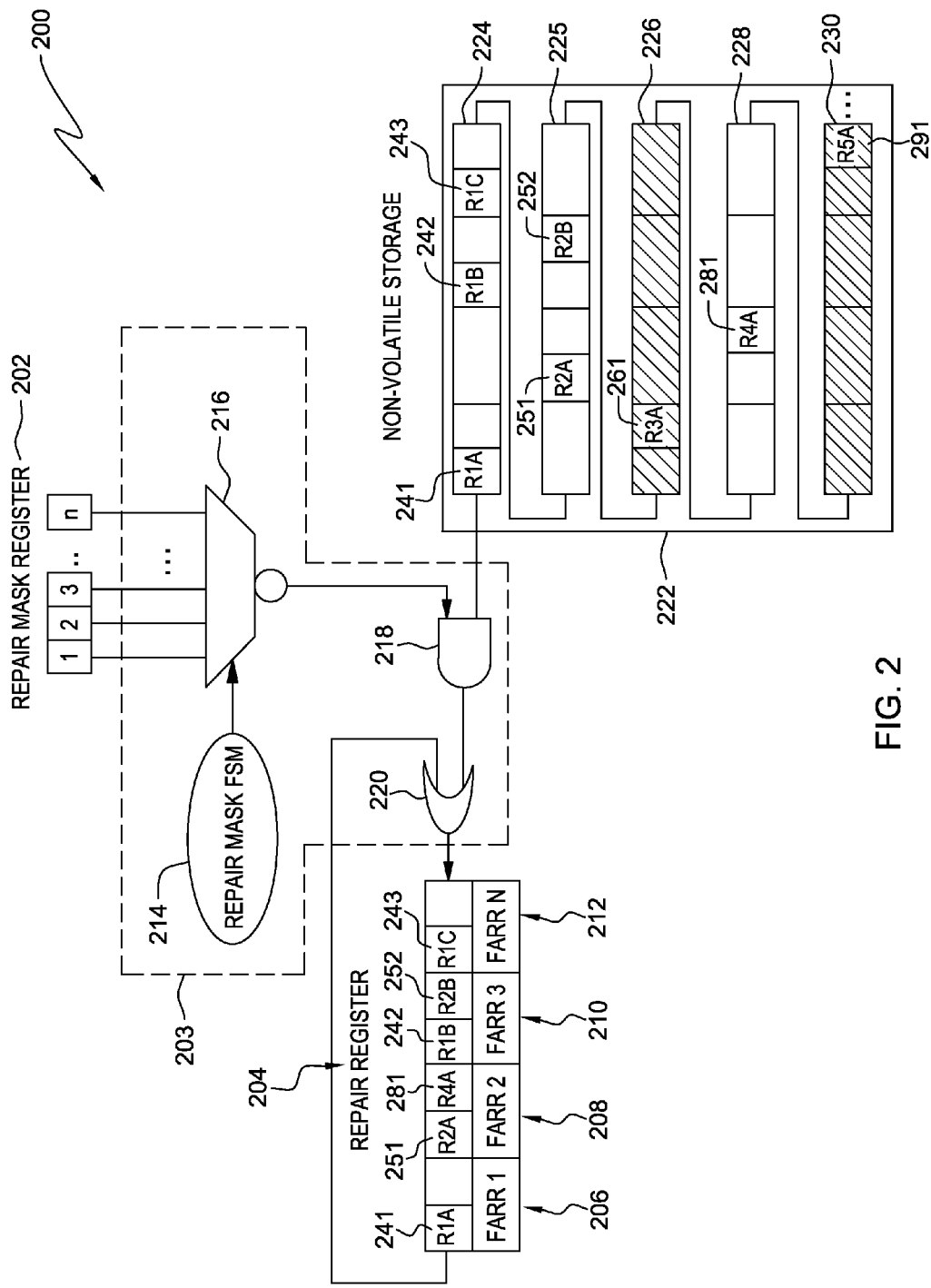
FIG. 2 shows one embodiment of the repair circuitry according to embodiments of the invention having repair mask register for allowing selectable repair pass masking.

The embedded memory test and repair subsystems, such as the one disclosed here, usually utilize one or more non-volatile storage elements for permanently storing the memories' repair solutions. Embodiments of the present invention contemplate utilization of such non-volatile storage element 222, for example, a fuse bay, as shown in FIG. 2. A fuse bay generally includes a large number of e-fuses chained together in e-fuse arrays. As illustrated in FIG. 2, for this non-limiting exemplary implementation, an embedded memory test and repair subsystem actually contains only one non-volatile storage element 222. As shown in FIG. 2, non-volatile storage element 222 may be implemented as one contiguous block of arrays of embedded e-fuses that stores separate repair passes incrementally. A person of ordinary skill in the art would understand that embedded non-volatile storage 222 uses a relatively large amount of chip area. Therefore, it might be desirable to use data compression in order to minimize the number of fuse bits required to store the full redundancy solution for all the embedded memory arrays on a given chip.

Testing of memory arrays in a conventional memory chip using a tester program often involves running BIST engines inside the memory chip through multiple testing passes. It must be noted that testing memory in multi-pass fashion involves using any number of different test conditions to fully test the memory. When all test passes are performed at all desired test conditions (e.g. high and low voltage, temperature, retention pause, etc.), the memory is finally determined to have passed self-test and repair. Existing implementations of BIST methodology accumulate repair solutions across multiple tests and result in one final repair solution for each testing pass. This repair solution that was accumulated in one test pass will be referred to hereinafter as a repair pass. Embodiments of the present invention advantageously enable flexibility of selecting a subset of all repair passes for masking. Furthermore, embodiments of the present invention provide the ability to permanently alter the chip so that this masking persists beyond testing process.

FIG. 1 is a flowchart illustrating a method for selectively repairing an embedded memory module utilizing selectable repair pass masking, in accordance with embodiments of the present invention. For this non-limiting exemplary embodiment it is assumed that an external tester program is used to test the chip. A person of ordinary skill in the art would understand that while a test program may comprise a suite of many tests packaged together and run against each chip to validate it, for the purposes of this invention we need only consider tests used to test embedded memory content. FIG. 2 shows one embodiment of the repair circuitry according to embodiments of the invention having repair mask register for allowing selectable repair pass masking. The operation of method 100 in this example is described with reference to both FIGS. 1 and 2. It should be appreciated that the following description provides only an illustration of one implementation and does not imply any limitations with regard to the architecture in which different embodiments may be implemented. Many modifications to the depicted architecture may be made.

According to an embodiment of the present invention, at step 102, the tester program starts the first test pass. The tester program typically interfaces with the BIST controller to initialize all BIST engines and select arrays to be tested for each test pass. The initialization test sequence typically applies a scan, which initializes the BIST engines and repair register 204 appropriately. At step 104, the tester program instructs BIST engines to test selected embedded memory arrays under a first set of operating conditions (e.g., with a certain voltage applied to the memory under a certain temperature). For instance, for each row (regular or redundant), the BIST engine writes into the row and then later reads from that row. If the read data is different from the written data, the row is defective. If the read data is the same as the written data, the row is fine with that particular test pattern. At step 106, the BIST engine obtains a repair solution in response to identifying non-operational memory elements. Then the BIST engine moves on to the next row of the memory array. When done, at step 108, all BIST engines accumulate repair information in the repair register 204. At step 110, the tester program makes a determination whether a current test pass is completed. It must be noted that each test pass may comprise a plurality of tests that can be run in one power-up. Thus, if there are more tests to run in the current test pass, method 100 returns to step 104. Otherwise, this point in time marks the completion of first test pass and the method 100 proceeds to step 112. Step 112 involves permanently storing the repair solutions accumulated in repair register 204 in a non-volatile storage element 222, such as a fuse bay. In one embodiment, after a test pass is completed, the repair solutions will be shifted from repair register 204 into repair data processor 304 described below, where in a preferred embodiment they will be shifted through the compression logic. Repair solutions may be compressed in repair data processor 304 by any compression method known to a person of ordinary skill in the art. Then, repair data processor 304 initiates a writing process by shifting the repair solutions accumulated in repair register 204 into non-volatile storage element 222. As a result, after the writing process is completed, non-volatile storage element 222 contains the repair solution for a given test pass. This repair solution constitutes a repair pass discussed herein. Then the tester program decides at step 114 whether the current test pass completes the test based on a predetermined test flow strategy. If so, the method 100 stops 118. If the answer is negative, step 116 is performed.

One skilled in the art will recognize that before the next test pass begins it might be desirable to selectively reconstruct (step 116) any combination of repair passes stored in non-volatile storage 222. For example, assume that the total number of five test passes had been run up to this point in time, and a total number of five repair passes has been stored in non-volatile storage 222. However, some of the repair passes may be optional repairs that may only be restored at a specific temperature. In this scenario, it might be desirable to store these optional repair passes in non-volatile storage 222 for later use and restore only a subset of all repair passes in order to maintain the good chip yield for the required testing. According to embodiments of the present invention, creation of this custom repair solution from all available repair passes stored on the chip is handled entirely in hardware as described below in conjunction with FIG. 2.

There are a few components provided by embodiments of the present invention and illustrated in exemplary circuit 200 that enable on-chip selective restoration of repair passes. In a preferred embodiment a Repair Mask Register (RMR) 202 is used for volatile storage of a mask that will be used to control selective restoration of stored repair passes. According to the present embodiment, RMR 202 is a one-hot shift register. It will be described in more detail below.

Referring back to FIG. 1, at step 116 the tester program generates a string of masking bits based on previously discussed strategy to selectively restore a subset of repair passes stored on the chip. FIG. 2 shows an exemplary N-bit RMR 202. It must be noted that the bit length of RMR 202 limits the number of repair passes that can be "masked off". While, according to the embodiments of the present invention the length of RMR 202 is theoretically unlimited, there are some practical limitations. For example, the number of repair passes one might want to restore will directly increase the chip initialization time. Therefore, practical limitations should be taken into account at a design time when calculating adequate RMR 202 length. A simple review of past qualification test programs may yield an appropriate register length. After step 116 method 100 returns back to step 104.

In addition to RMR 202, circuit 200 comprises a repair register 204, a non-volatile storage element 222, and control logic elements 203, such as a Repair Mask FSM (Finite State Machine) 214, a control multiplexer 216, an AND gate 218, and an exclusive OR (EXOR) gate 220. Repair Mask FSM 214 may be adapted to keep track of the total number of repair passes stored on a given chip. Repair Mask FSM 214 may also be adapted to monitor which repair pass is currently being tested and which repair pass is currently being restored to the chip from non-volatile memory and whether such repair pass is masked off.

While there are many different implementation options available, in this non-limiting exemplary embodiment non-volatile storage element 222 is implemented as one contiguous block of arrays of embedded e-fuses that stores separate repair passes incrementally. For example, in FIG. 2 non-volatile storage element 222 illustratively comprises five blocks allocated to store five repair passes. Specifically, blocks 224, 225, 226, 228, and 230 represent allocated storage for the repair passes 1, 2, 3, 4, and 5, respectively. It must be noted that each repair pass may comprise a plurality of actual repair solutions made during the corresponding test pass. Illustratively, in FIG. 2 the repair pass 1 comprises three actual repair solutions that were obtained during the first test pass: R1A 241, R1B 242 and R1C 243. Similarly, the second repair pass comprises two actual repair solutions generated during the second test pass: R2A 251 and R2B 252. Furthermore, each of the repair passes number three, four and five, in this example, are represented by the repair solutions R3A 261, R4A 281, and R5A 291, respectively.

Many memory array redundancy schemes employ several failing address repair registers (FARRs). FARR is a shift register where all repair solutions are accumulated during BIST tests. This register is also used for controlling enablement of a corresponding redundant memory element. For example, when the memory is being used in an operational mode, compare circuitry is used to match the read or write address with the addresses in the FARRs. If the functional address matches a FARR entry, the read or write is mapped to the redundant memory element. Typically, each BIST engine has its own FARR register. Illustratively, in this example N different FARR registers are employed, such as FARR1 206, FARR2 208, FARR3 210 up to FARR N 212, where N is an integer number. Repair register 204 is a global register and comprises a collection of all FARRs 206, 208, 210, 212 employed by the system in both operational and test mode. It must be noted that the length of repair register 204 will depend on a particular chip design, specifically, it will depend on the number of FARR registers 206, 208, 210, 212 utilized by the chip, as well as the length of each FARR 206, 208, 210, 212.

As a non-limiting example of how the circuit 200 presented in FIG. 2 operates, assume that the length of RMR 202 is 8 bits, for simplicity reasons. In general, RMR 202 can have any number of bits (i.e., any length). Further assume in this exemplary embodiment that at step 116 of method 100, the tester program generated the following mask comprising the string of masking bits—"00101000", which is being stored in RMR 202. The bit pattern stored in RMR 202 comprises a conventional digital mask; that is, a "1" in a particular bit position of the mask indicates that the repair pass associated with that bit position does not need to be restored. In other words, repair mask FSM 214 is now set to "mask off" repair passes 3, i.e. R3A 261, and 5, i.e. R5A 291, because the mask contains "1"s in positions 3 and 5 respectively. In this exemplary embodiment, when repair data processor 304 attempts to restore repair passes stored in non-volatile storage element 222 into repair register 204, either in test or operational mode, control logic 203 will prevent restoration of the third (R3A 261) and fifth (R5A 291) repair passes. FIG. 2 shows the state of repair register 204 after the restore operation. As illustrated in FIG. 2, repair register 204 does not contain R3A 261 and R5A 291, which would be restored without the mask described above.

In this exemplary embodiment, all individual latches of RMR 202 are electrically coupled to multiplexer 216. Multiplexer 216 also receives a control signal from repair mask FSM 214. The output of multiplexer 216 is coupled to one input of AND gate 218. Another input of AND gate 218 is electrically coupled to non-volatile storage element 222. The output of AND gate 218 is connected to an input of EXOR gate 220. Another input of EXOR gate 220 is connected to repair register 204. The EXOR gate 220 is provided in circuit 200 in order to allow multiple passes to be overlaid in repair register 204. In summary, control logic 203 of circuit 200 during repair pass restoration operation makes the comparison of current repair pass and a repair mask stored in the RMR 202 and allows selective restoration of selected repair passes.

Figure 3:
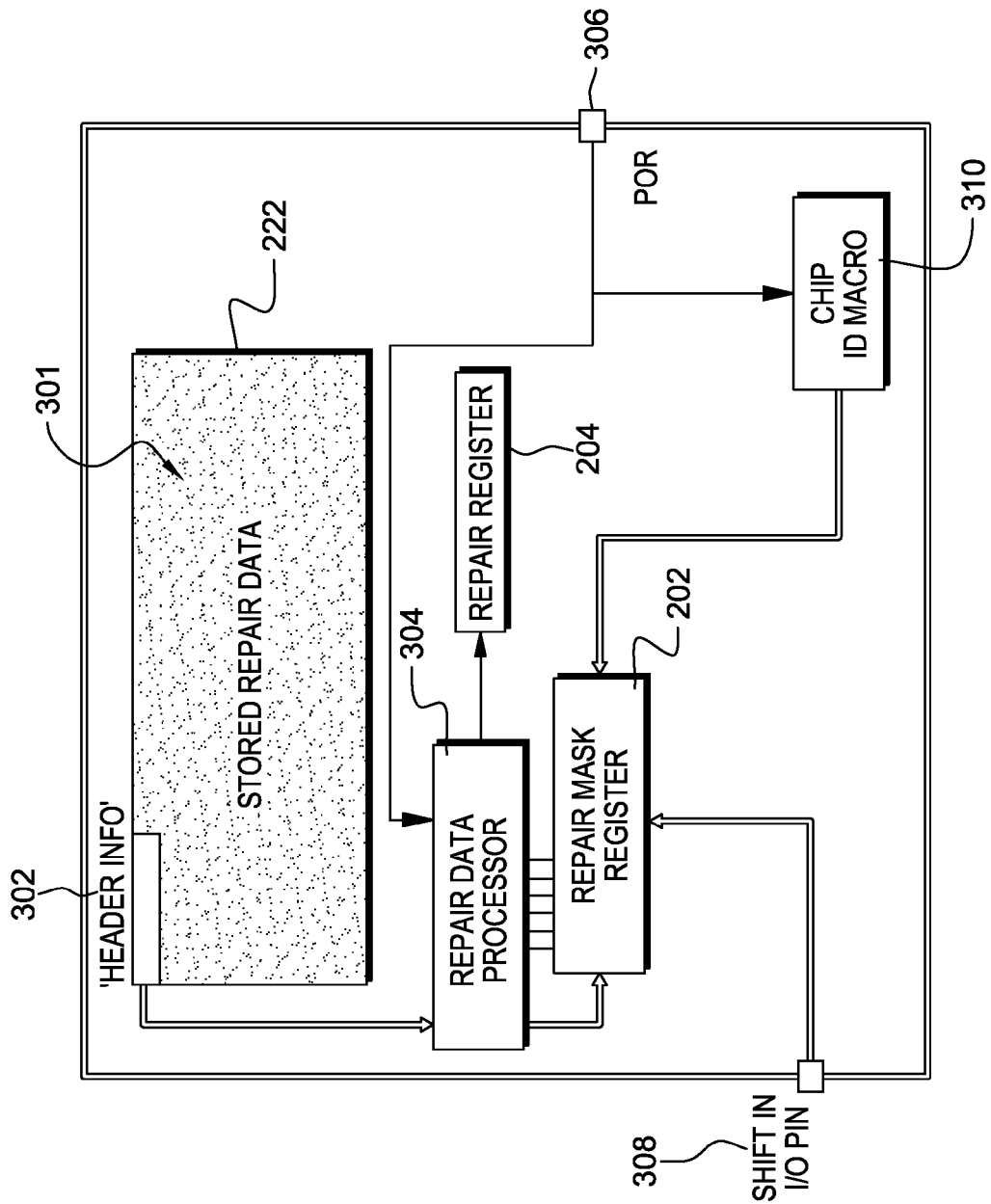
FIG. 3 is a schematic diagram illustrating components of a selectable repair pass system and showing exemplary options for setting the repair mask register of FIG. 2.

FIG. 3 is a schematic diagram illustrating components of a selectable repair pass system and showing exemplary options for setting RMR 202 of FIG. 2. In the embodiment described above in conjunction with FIG. 2, RMR 202 was updated directly by the tester program, for example, via an IC I/O pin under the command of the shift 308, as shown in FIG. 3. This preferred loadable shift register implementation of RMR 202 enables characterization test, for example, to implement multiple different mask repair solutions in one test pass. In an alternative embodiment, when a chip enters operational mode, RMR 202 may be initialized by Power on Reset (POR) signal 306. In this embodiment, repair mask information, such as masking bits described above in conjunction with FIG. 2, may be stored in non-volatile storage element 222, for example but not limited to a fuse bay, along with repair pass information in a special header position 302. FIG. 3 shows an example of the permanent storage arrangement in non-volatile storage 222. In this exemplary arrangement, the header 302 position is fixed and known to Repair Mask FSM 214. The remaining part 301 of non-volatile storage 222 is reserved for storing repair pass information.

Another component that enables selective restoration of stored repair passes is a repair data processor 304 shown in FIG. 3. Repair data processor 304 is used to perform the operational mode tasks used to store and recover repair pass data. As previously indicated, it is desirable to use data compression in order to minimize the size of the storage required to store the full redundancy solution for all the embedded memory arrays on a given chip. Consequently, repair data processor 304 may contain a compress/decompress engine to accomplish this. Under operational mode, repair data processor 304 is responsible for reading and shifting the stored repair data 301 from non-volatile storage 222 into the memories' repair register 204, as shown in FIG. 3. During test, repair data processor 304 is additionally used to shift the BIST updated repair solutions from the memories' repair register 204 to non-volatile storage element 222 and verify that repair solutions are correctly stored. It must be noted that in this embodiment repair data processor 304 includes control logic 203 shown in FIG. 2. Furthermore, in this embodiment, repair data processor 304 may also include logic that upon receiving POR signal 306 will first process repair mask data stored in header 302 and subsequently load that data into RMR 202. Alternatively, in test mode, the tester program could read header 302 and write that mask data directly into RMR 202 via, for example, IC I/O pin 308 under command of the shift.

In another alternative embodiment, repair mask information may be stored in an on-chip ID macro 310. Typically IC manufacturers utilize an on-chip ID macro 310 of a chip, for example but not limited to Electronic Chip ID (ECID) macro, for storing non-test related data (e.g. chip identification data, such as lot number, wafer ID, chip coordinates). However, in this case on-chip ID macro 310 could also be programmed at chip manufacture time to additionally store repair mask data. In this case, when a chip is powered up in operational mode, repair mask data will be propagated from on-chip ID macro 310 to RMR 202 via POR signal 306, as shown in FIG. 3. Alternatively, in test mode, the tester program could read on-chip ID macro 310 and write that mask data directly into RMR 202 via, for example, IC I/O pin 308 under command of the shift.

Figure 4:
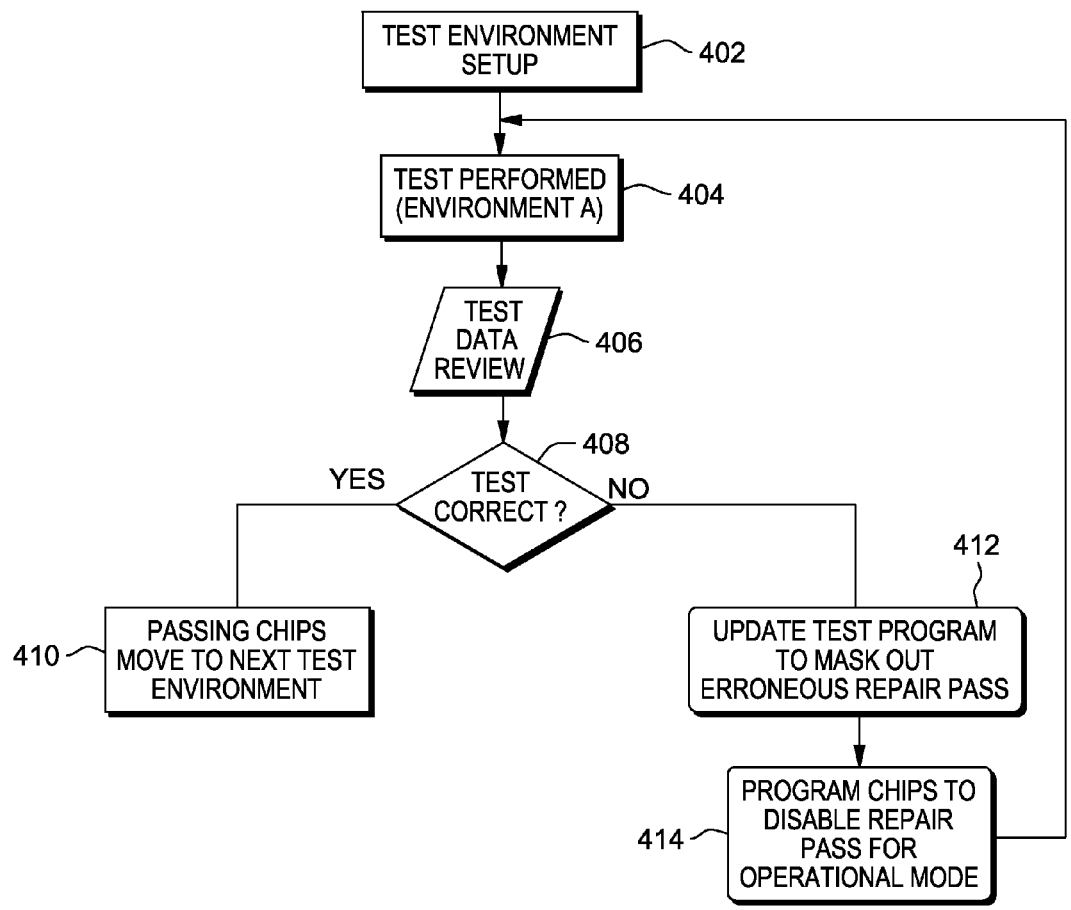
FIG. 4 is a flowchart illustrating an enhanced embedded memory testing process enabling recovery of redundant memory elements after erroneous test utilizing the method of FIG. 1.

It can be seen that RMR 202 is a convenient means for both customizing a repair solution from all available repair passes stored on a chip and for restoring redundant memory elements for future tests. FIG. 4 is a flowchart illustrating an enhanced embedded memory testing process enabling recovery of redundant memory elements after erroneous test utilizing the method of FIG. 1. Before actual testing commences, typically the testing environment should be set. This process begins at step 402 by setting a testing environment. Setting a testing environment involves, for example, setting testing voltages, testing temperatures, etc. Next, BIST testing is performed in this environment (step 404), which includes initializing the circuit inside, inputting the test pattern and comparison, identifying and storing repair passes, as discussed above. After each test pass, a review of chip yields and characterization data is performed at step 406. At step 408 testing personnel decides whether the result of test pass is good or defective. If the result of test pass is good, passing chips move to the next test environment, i.e. next test pass, at step 410. However, the review of test data may lead to the discovery of an error in the applied test program. For any embedded memory, this could mean that a significant portion of the sparsely available redundant elements had been erroneously utilized. At this point simply retesting with the corrected test program may suffer degraded yields. However, the novel method of masking out the erroneous repair pass according to embodiments of the present invention enables embedded memory retest with full access to all redundant memory elements. To accomplish this result the test program is updated (step 412) to "mask out" the erroneous repair pass. As previously indicated, the test program has an ability to update RMR 202 directly via and I/O pin as shown in FIG. 3. Therefore, it will set the masking bit corresponding to the erroneous repair pass to "1". As it was previously indicated, a "1" in a particular bit position of the mask indicates that the repair pass associated with that bit position does not need to be restored. At step 414, a chip is programmed to disable the erroneous repair pass in operational mode. According to embodiments of the present invention this step could be implemented by permanently storing a repair mask data in non-volatile storage 222 or by storing a repair mask data in an on-chip ID macro 310, as discussed above. At this point the process returns to step 404. In summary, software changes to the test program, as well as the programming of each chip to permanently ignore the faulty repair pass for operational mode in accordance with embodiments of the present invention can advantageously allow a full recovery of yield.

Figure 5:
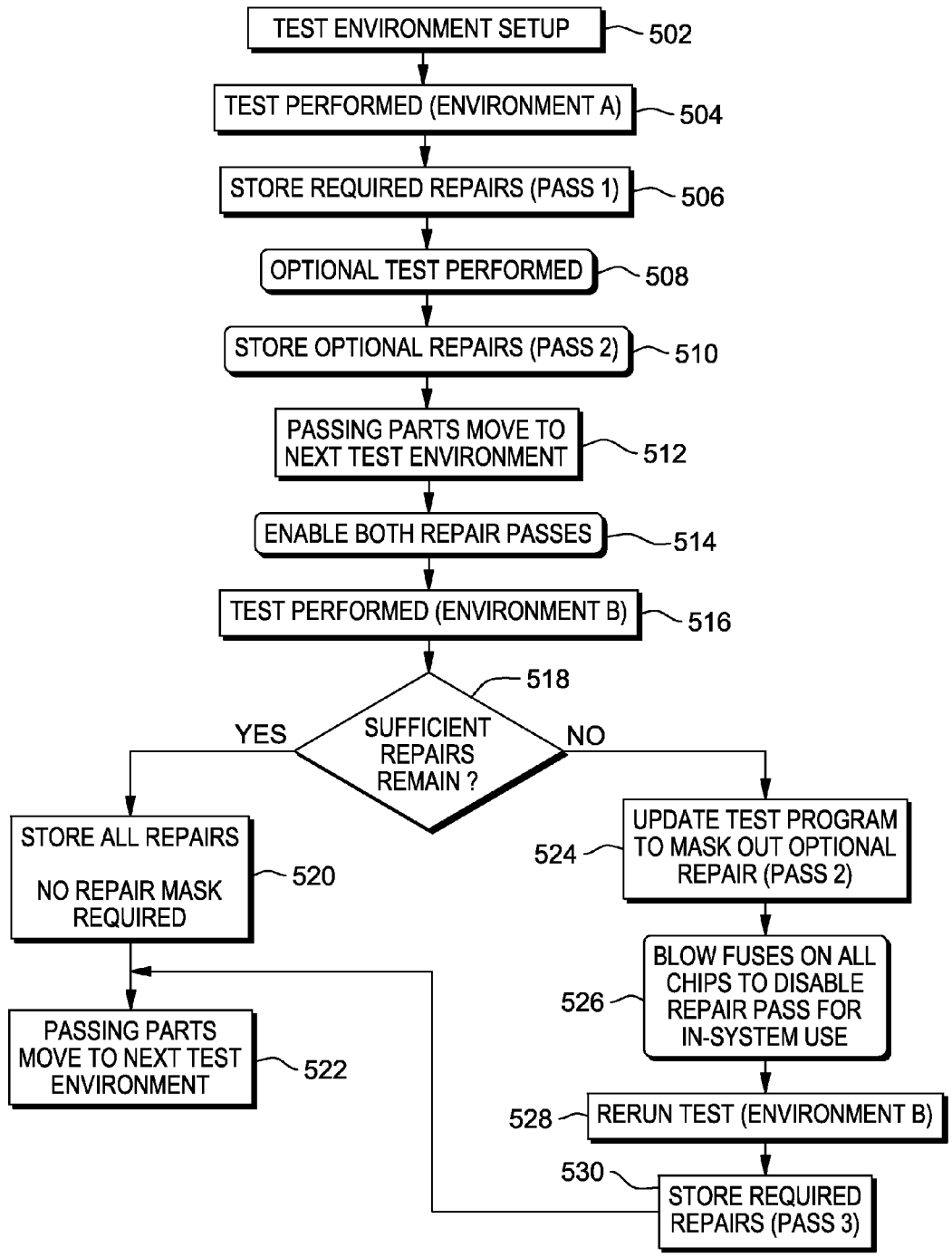
FIG. 5 is a flowchart illustrating another enhanced embedded memory testing process enabling high quality tests while optimizing yields by utilizing the method of FIG. 1.

FIG. 5 is a flowchart illustrating another enhanced embedded memory testing process enabling high quality tests while optimizing yields by utilizing the method of FIG. 1. This flow is an example of how the ability to "mask off" repair passes may be utilized to save optional repairs from one test environment and apply them to a second test environment, but only if they do not significantly impact yield. This process begins by setting up first test environment at step 502 and performing a test in that environment (step 504). Steps 502 and 504 are substantially similar to steps 402 and 404 in FIG. 4. At step 506, repair pass 1 is stored in a non-volatile storage element 222. In accordance with embodiments of the present invention, repair pass 1 may be stored, for example, in the block allocated to store repair pass 1 224 in non-volatile storage 222, as shown in FIG. 2. Optional test (for example, but not limited to, different test patterns) in first test environment is performed at step 508. Subsequently, repair pass 2 is stored 510 in block 225. At step 512 passing chips move to the next test environment, i.e. next test pass. In the second test environment all repair passes are loaded at first by enabling both repair passes at step 514. According to embodiments of the present invention, both repairs can be enabled by setting the mask value to all "0" as discussed above. At step 516, a chip test is performed in the second environment under a different set of operating conditions. At step 518 the tester can compare the number of repairs made against predetermined criteria to decide whether a sufficient number of redundant memory elements remain. If so, then all repair passes are stored permanently in non-volatile storage element 222 and no changes to the repair mask are required at step 520. At this point all passing chips move to the next test environment 522 (next pass). However, if the optional test performed in step 508 had utilized a substantial portion of redundant elements, the novel method of disabling repair passes in accordance with embodiments of the present invention could be utilized to disregard the repair pass associated with the optional test (block 225). To accomplish this, the test program will be updated at step 524 to mask out the repair pass 2. In other words, the test program will update the content of RMR 202 by setting the masking bit associated with the second repair pass to "1". At step 526, chips are programmed to disable an optional repair pass for operational mode (as described regarding step 414 above). At step 528, the test performed in step 516 can be run again. Repair solutions associated with the latest test pass can be permanently stored (step 530) in non-volatile storage 222. At this point the process can proceed to step 522. The flowchart presented in FIG. 5 illustrates the ability to utilize the repair mask in accordance with embodiments of the present invention to selectively disregard optional repairs if those repairs significantly impact yield levels.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method for selectively repairing an embedded memory module having memory elements in an integrated circuit chip, the method comprising:
    performing a plurality of tests on the embedded memory module under operating conditions to identify non-operational memory elements in the embedded memory module;
    in response to identifying the non-operational memory elements, accumulating a plurality of corresponding repair solutions in a repair register while performing the plurality of tests;
    storing the plurality of corresponding repair solutions, accumulated in the repair register, in a non-volatile storage element; and
    determining from a mask a subset of the plurality of corresponding repair solutions that should be restored.

2. The method of claim 1, wherein the non-volatile storage element comprises a programmable fuse bay.

3. The method of claim 1, wherein storing the plurality of corresponding repair solutions further comprises compressing the plurality of corresponding repair solutions to produce a compressed repair solution and storing the compressed repair solution in the non-volatile storage element.

4. The method of claim 3, wherein compressing the plurality of corresponding repair solutions and storing the compressed repair solution is performed by a repair data processor.

5. The method of claim 1, wherein the mask comprises a plurality of mask bits and wherein each of the plurality of mask bits corresponds to at least one of the plurality of corresponding repair solutions stored in the non-volatile storage element and each of the plurality of mask bits indicates whether the corresponding at least one repair solution should be restored.

6. The method of claim 1, wherein a repair mask register is used for temporary storage of the mask.

7. The method of claim 6, wherein the repair mask register is initialized by a power on reset signal.

8. The method of claim 1, wherein the mask is stored in the non-volatile storage element.

9. The method of claim 8, wherein the non-volatile storage element comprises an electronic chip ID macro.

10. The method of claim 1, wherein the plurality of corresponding repair solutions comprises at least one erroneous repair solution and wherein the mask is set to prevent the at least one erroneous repair solution from being restored in operational mode.

11. The method of claim 1, wherein the plurality of corresponding repair solutions comprises a plurality of repair passes and wherein each of the plurality of repair passes comprises a repair solution accumulated in the repair register after performing one test on the embedded memory module.

12. A circuit for selectively repairing an embedded memory module having memory elements in an integrated circuit chip comprising:
    a repair register adapted to accumulate a plurality of repair solutions while a plurality of tests is performed on the embedded memory module under operating conditions to identify non-operational memory elements in the embedded memory module;
    a non-volatile storage element adapted to store the plurality of repair solutions, wherein the plurality of repair solutions is generated in response to identifying the non-operational memory elements;

a repair mask register adapted to store a plurality of mask bits associated with each of the plurality of repair solutions stored in the non-volatile storage element; and a control logic for selectively restoring a subset of the plurality of repair solutions stored in the non-volatile storage element based on the mask bits, wherein the control logic is electrically coupled to the repair register, the non-volatile storage element and the repair mask register.

13. The circuit of claim 12, wherein the non-volatile storage element comprises a programmable fuse bay.

14. The circuit of claim 12, wherein the control logic comprises:

a repair mask finite state machine adapted to control the repair mask register;

a control multiplexer having a data input connected to the repair mask register and having a control input connected to the repair mask finite state machine;

an AND gate having a first input connected to an output of the control multiplexer and having a second input connected to the non-volatile storage element; and an exclusive OR gate having a first input connected to the repair register and having a second input connected to an output of the AND gate and having an output connected to the repair register.

15. The circuit of claim 12, wherein the embedded memory module comprises one or more of: an SRAM embedded memory array, a DRAM embedded memory array, a TCAM embedded memory array or embedded ROM.

16. The circuit of claim 12, wherein the non-volatile storage element is adapted to store the plurality of mask bits associated with each of the plurality of repair solutions stored in the non-volatile storage element.

17. The circuit of claim 12, wherein the repair mask register is initialized by a power on reset signal.

18. The circuit of claim 12, wherein the plurality of repair solutions comprises at least one erroneous repair solution and wherein the masking bits are set to prevent the at least one erroneous repair solution from being restored in operational mode.

19. The circuit of claim 12, wherein the plurality of mask bits are loaded into the repair mask register through an I/O pin of the chip.

20. The circuit of claim 12, wherein the repair register is adapted to accumulate a plurality of repair passes while a plurality of tests is performed on the embedded memory module, wherein each of the plurality of repair passes comprises a repair solution accumulated in the repair register after performing one test on the embedded memory module.

* * * * *